United States Patent [19]

Russell

[11] 4,065,680
[45] Dec. 27, 1977

[54] COLLECTOR-UP LOGIC TRANSMISSION GATES

[75] Inventor: Lewis K. Russell, San Jose, Calif.

[73] Assignee: Signetics Corporation, Sunnyvale, Calif.

[21] Appl. No.: 685,503

[22] Filed: May 12, 1976

Related U.S. Application Data

[63] Continuation of Ser. No. 487,756, July 11, 1974, abandoned.

[51] Int. Cl.² .............................................. H03K 19/40
[52] U.S. Cl. .................................... 307/214; 307/213; 307/303; 357/44; 357/46
[58] Field of Search ................ 307/213, 214, 248, 253, 307/254, 255, 303, 313; 357/40, 44, 46

[56] References Cited

U.S. PATENT DOCUMENTS 3,736,477  5/1973  Berger et al. ........................ 357/46 X Primary Examiner—John Zazworsky
Attorney, Agent, or Firm—C. Richard Pfeiffer; William H. Dana

[57] ABSTRACT

Unidirectional and bidirectional bipolar logic transmission gates have an input, an output, a gate control, supply and common terminals. The unilateral transmission gate circuit includes first and second switching transistors and associated first and second source tranisistors. The transistors each have collector, base and emitter electrodes, said first source transistor emitter being connected to said supply terminal. The collector of the first switching transistor is connected to the base of the second switching transistor and defines a gate logic node. The base of the first switching transistor is connected to the first input terminal and the collector of the second switching transistor is connected to the output terminal with both switching transistor emitters being connected to the common terminal. Gate switching means is connected between said gate logic node and said gate control input, said means being responsive to first and second logic levels at said gate control input for driving said gate logic node to first and second states causing the transmission gate to assume open and closed states from input to output. A bidirectional bipolar logic transmission gate includes an additional gate logic node and gate switching means simultaneously drives said gate logic node and additional gate logic node to first and second states causing the transmission gate to assume bilateral open and closed states between said first and second input and output terminals.

1 Claim, 12 Drawing Figures

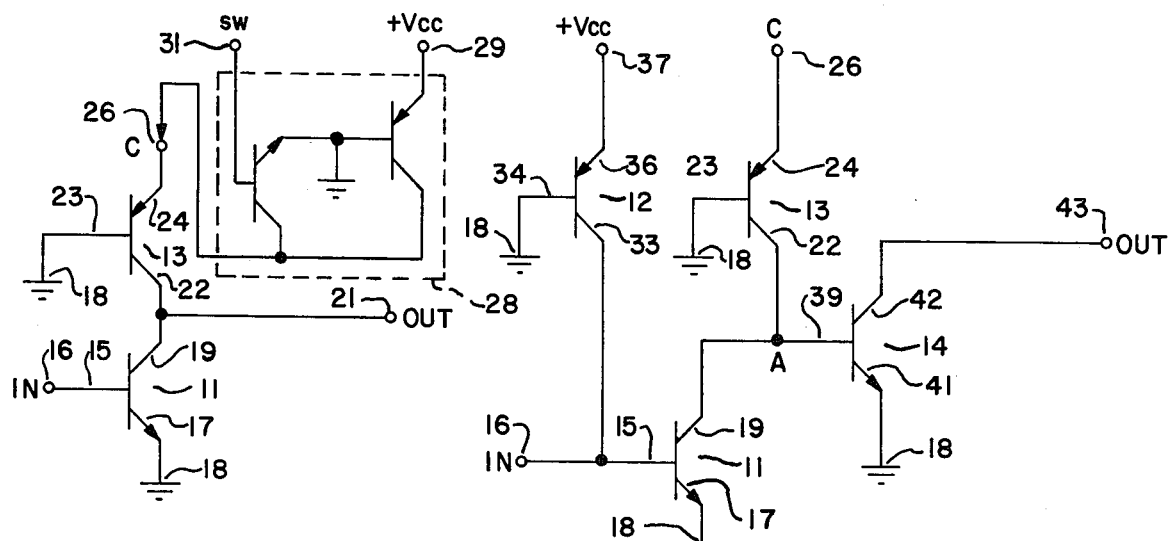
FIG.—1A
FIG.—1B
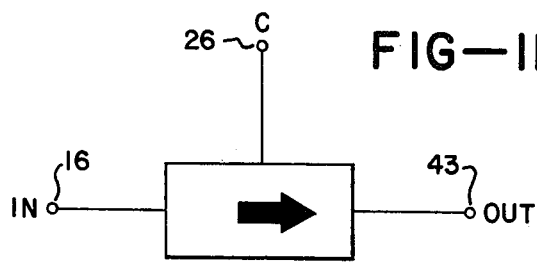
FIG.—1C
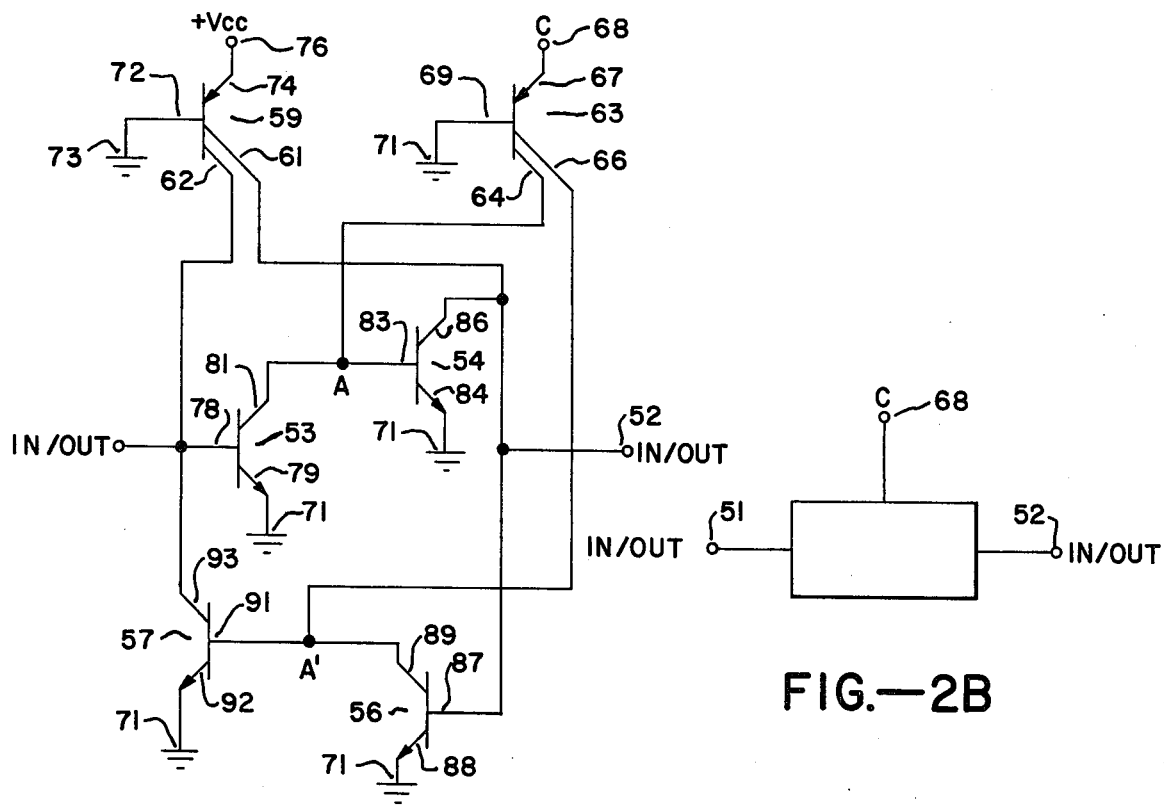
FIG.—2A
FIG.—2B

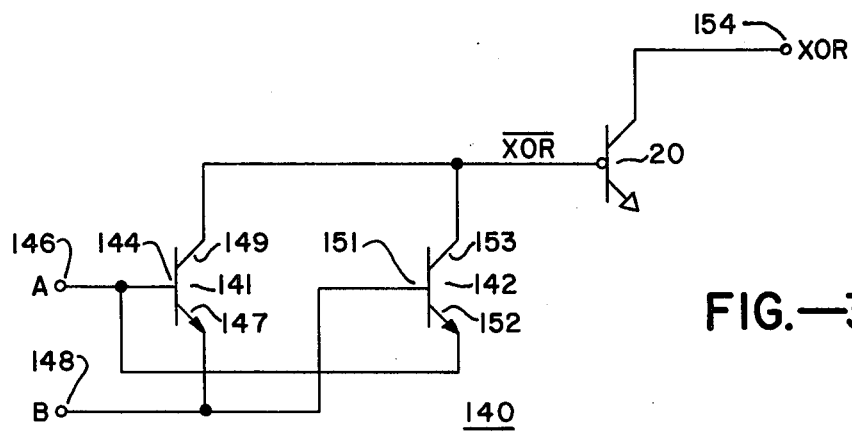
FIG.—3A
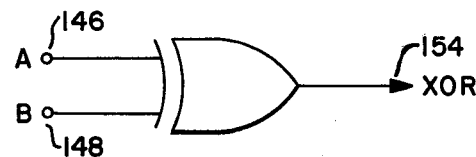
FIG.—3B
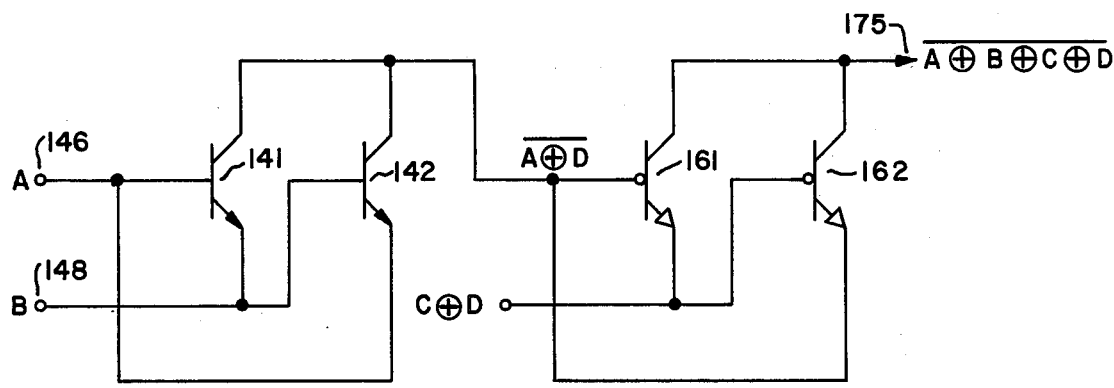
FIG.—3C
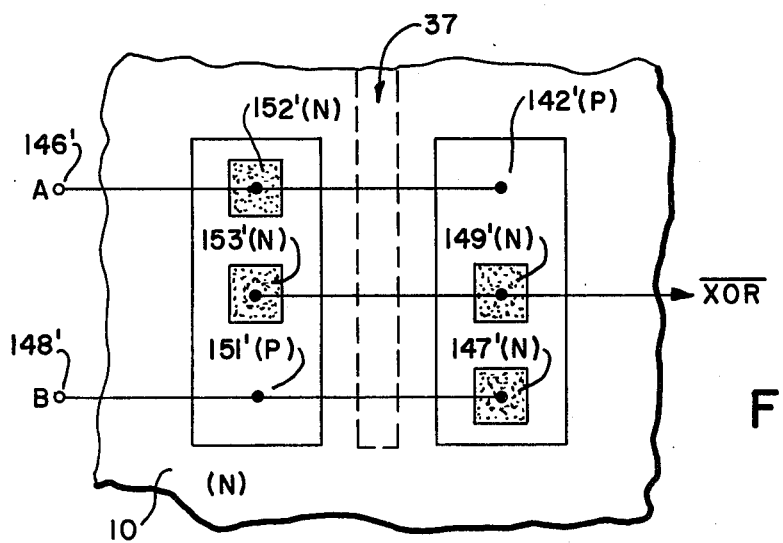
FIG.—3D

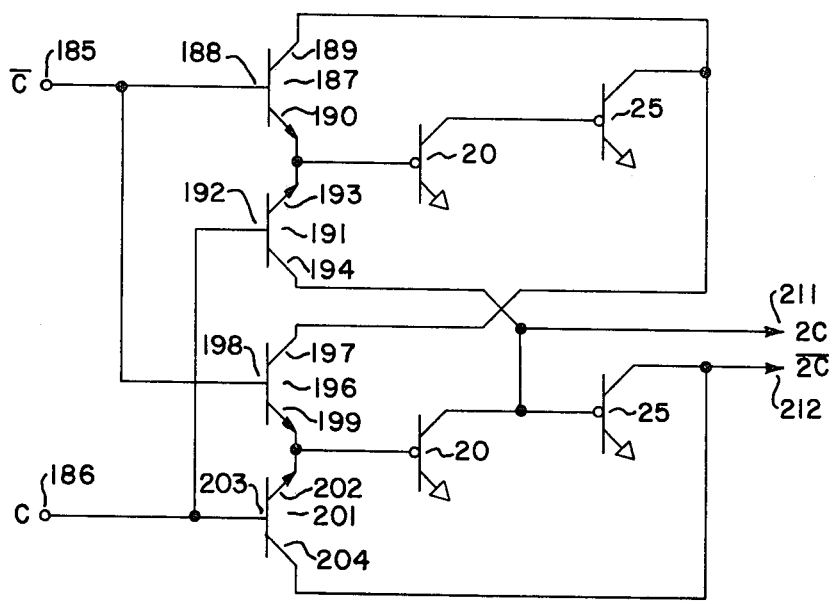
FIG.—4A
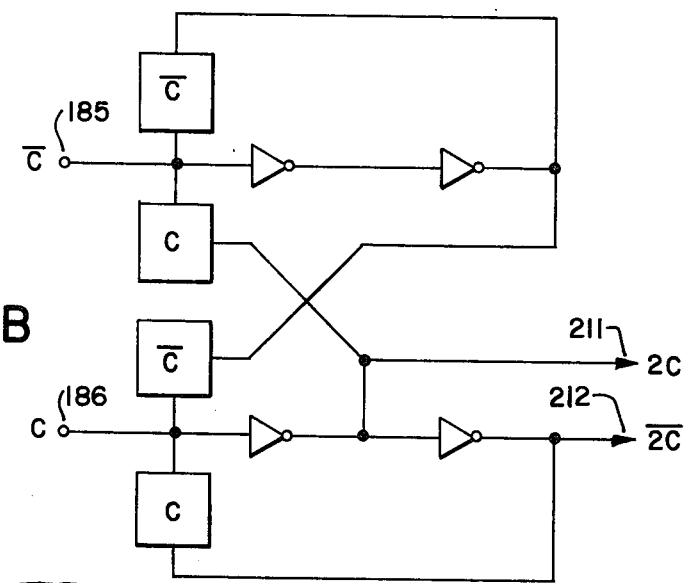
FIG.—4B
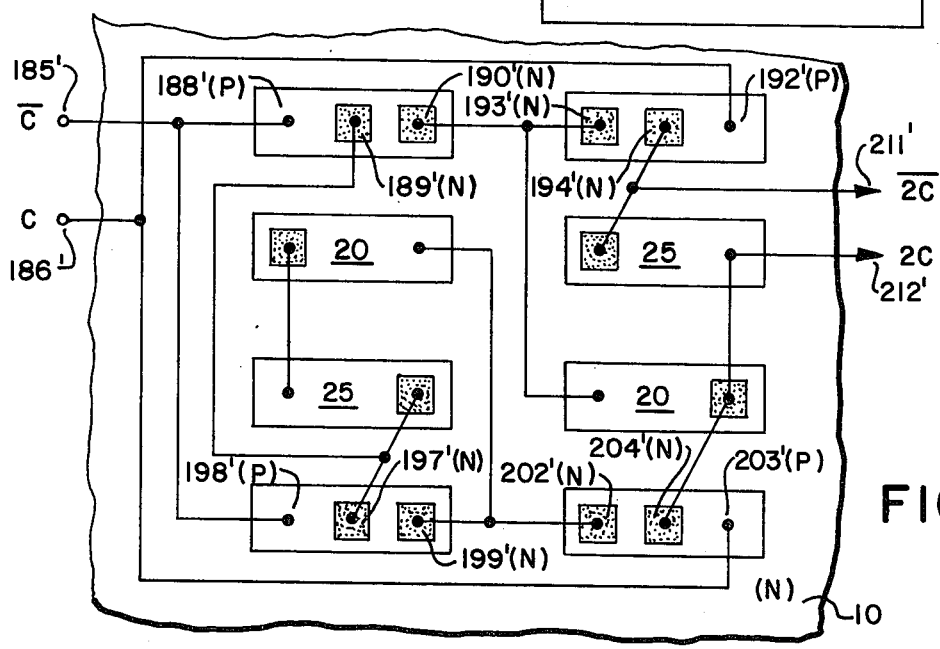
FIG.—4C

COLLECTOR-UP LOGIC TRANSMISSION GATES

This is a continuation of application Ser. No. 487,756 filed July 11, 1974, and now abandoned.

BACKGROUND OF THE INVENTION

This invention relates generally to bipolar semiconductor unilateral and bilateral switching structures and a method for gating such structures. More particularly, this invention relates to bipolar semiconductor transmission gate switching structures suitable for implementation in integrated injection logic or collector-up circuitry.

Although transmission gates, a form of electronic signal control valves, have long been known in MOS semiconductor technology, transmission gates in bipolar technology have not proved entirely satisfactory. Unidirectional transmission gates are desirable to permit a signal to pass in one direction in response to an electronic, generally binary, "on" or "off" signal. Bilateral transmission gates are desirable to permit a signal to pass freely in either direction in response to a control signal. Thus there is a need for unilateral and bilateral transmission gates implemented in bipolar technology.

OJBECTS AND SUMMARY OF THE INVENTION

Accordingly, it is a general object of the present invention to provide improved performance, unidirectional and bidirectional transmission gates in bipolar technology.

It is a particular object of the present invention to provide a unidirectional and bidirectional transmission gate implemented in integrated injection logic or collector-up circuitry.

The foregoing and other objects of the invention are achieved in unidirectional and bidirectional transmission gates and gating method, and unidirectional bipolar logic transmission gate being of the type having an input, an output, a gate control, supply and common terminals, the transmission gate circuit including first and second switching transistors and associated first and second source transistors. The transistors each have a collector, common base and emitter electrodes, said first source transistor emitter being connected to said supply terminal. The collector of the first switching transistor is connected to the base of the second switching transistor, said connection defining a gate logic node. The base of the first switching transistor is connected to the input terminal and the collector of the second switching transistor is connected to the output terminal with both switching transistor emitters connected to the common terminal. Gate switching means is connected between said gate logic node and said gate control input, said means being responsive to first and second logic levels at said gate control input for driving said gate logic node to first and second states causing the transmission gate to assume open and closed states from input to output.

DESCRIPTION OF THE DRAWINGS

FIG. 1A is a schematic of an inverting bipolar logic transmission gate, FIG. 1B a schematic of a unidirectional bipolar logic transmission gate, and FIG. 1C is a symbolic representation of the FIG. 1B transmission gate.

FIG. 2A is a schematic diagram of a bidirectional bipolar logic transmission gate having first and second input/output terminals, and FIG. 2B is a symbolic representation of the FIG. 2A transmission gate.

FIG. 3A is a schematic diagram of an EXCLUSIVE OR circuit showing collector-up assemblies. FIG. 3B is a symbolic representation of the FIG. 3A circuit. FIG. 3C is a cascaded, EXCLUSIVE OR circuit. FIG. 3D is a top view of the FIG. 3A circuit implemented in collector-up technology.

FIG. 4A is a schematic diagram of a Dividi-by-Two circuit showing collector-up circuit symbols, FIG. 4B is a symbolic logic diagram of the FIG. 4A circuit, and FIG. 4C is a top view of the FIG. 4A circuit implemented in collector-up technology.

DESCRIPTION OF THE PREFERRED EMBODIMENTS

A plurality of unidirectional and bidirectional bipolar transmission gates are shown in the accompanying Figures. Briefly, the transmission gates shown are implemented by utilizing integrated injection or collector-up semiconductor structures. Collector-up structures are disclosed in co-pending application COLLECTOR-UP SEMICONDUCTOR STRUCTURE AND METHOD, Ser. No. 454,789, filed Mar. 26, 1974, invented by Lewis K. Russell. The collector-up structure uniquely integrates a switching transistor in combination with a source transistor which injects carrier into the switching transistor. The collector-up structure utilizes the uppermost regions formed in the semiconductor body as collector regions, hence the designation "collector-up" structures.

In the present transmission gate invention conventional integrated injection logic may be implemented to form the gates, as well as collector-up structures. Collector-up structures are preferred because they may be formed in relatively high density arrays which operate at greatly reduced power levels. In a collector-up structure a relatively high gain source transistor is provided capable of efficiently injecting carriers into the base region of the switching transistor. For example an NPN switching transistor may have an associated P-N-P source transistor. The source transistor may be vertically configured and provide betas from 40 to 250. A supply voltage of 0.8 volts provides logic levels of approximately 0.7 volts and 0.02 volts. Although collector-up structures may be conventionally implemented to perform logic operations, they may be uniquely implemented as transmission gates as will now be seen.

Referring to FIG. 1A, a basic inverting transmission gate is shown. The gate includes a switching transistor 11 and source transistor 13. Source transistor 13 may provide a source of injected carriers to the next switching transistor connected at the output terminal as will later be shown. Switching transistor 11 may be an NPN transistor and source transistor 13 may be PNP transistor. Switching transistor 11 has a base electrode 15 connected to input terminal 16. An emitter electrode 17 is connected to a common or ground terminal 18. The collector 19 is connected to a gate logic node A and to output terminal 21. Source transistor 13 has a collector 22 connected to gate logic node A, a base electrode 23 connected to the ground or common terminal and an emitter 24 connected to a gate control terminal 26. External signal supply means 28 may supply a gate control signal to terminal 26 wherein the output of means 28 is connected to terminal 26. Means 28 provides both a gating signal and supply means for the inverting bipolar gate. Means 28 for purposes of illustration may have a $V_{cc}$ supply voltage input terminal 29 and a control input terminal $S_w$ 31, for purposes of illustration. Means 28 may have a circuit identical to the bipolar logic gate.

In operation, a signal applied at terminal 31 provides a gate control signal at terminal 26. When the gate control signal is high or at a first logic level, gate logic node A is driven to a normal positive level and transistor 11 may then function as a normal inverter, that is, for any signal applied at input terminal 16 an inverted output signal is provided at terminal 21. However, when a second or low logic level is provided at terminal 26, gate logic node A cannot rise above the ground of common terminal potential so that any input signal at terminal 16 is blocked and the output level at terminal 21 remains at ground or common terminal potential. It is thus apparent that when a first or high logic level is applied at gate control terminal 26 the gate assumes an open state from input terminal 16 to output terminal 21, thus freely passing signals. On the other hand, when a second or low logic level is applied at terminal 26 the gate assumes a closed state from input to output and thus interrupts the free passage of signals.

Although the inverting gate of FIG. 1A is useful, a non-inverting gate such as the transmission gate of FIG. 1B and 1C is more desirable. Referring to FIG. 1B, a first switching transistor 11 and associated first source transistor 12 are combined with a second switching transistor 14 and a second associated source transistor 13. The respective switching and associated source transistors schematically shown may correspond to an NPN switching and associated PNP source transistors of a collector-up semiconductor structure.

Switching transistor 11 and source transistor 13 have respective base, emitter and collector electrodes as previously described and connected. Source transistor 12 has a collector 33 connected to the base 15 of transistor 11, a base electrode 34 connected to common terminal 18 and an emitter 36 connected directly to a $V_{cc}$ supply terminal 37. Second switching transistor 14 has a base electrode 39 connected to voltage node A and emitter 41 connected to common terminal 18 and a collector 42 connected to an output terminal 43.

It is now apparent that source transistor 13 provides injected carriers for subsequent switching transistor 14 as was prevously mentioned. In operation, source transistor 12 provides injected carriers for associated switching transistor 11 of the collector-up semiconductor structure. The operation of transistors 11 and 13 is identical to that previously described in conjunction with FIG. 1A wherein an inverted signal was provided at voltage node A. When a first or high logic signal is provided at gate control terminal 26, transistor 13 in addition to the operation previously described also provides injected carriers for switching transistor 14. Switching transistor 14 again inverts the signal at voltage node A and provides a non-inverted signal at output terminal 43, with reference to input terminal 16. Thus, when terminal 26 is in a first or high logic level, signals freely pass from input terminal 16 through the transmission gate circuit to output terminal 43. When terminal 26 is in a second or low logic level node A cannot rise above ground, input signals at terminal 16 are thus blocked at transistor 11 and further injected carriers are no longer provided by source transistor 13 to associated switching transistor 14. Therefore the transmission gate interrupts signal passage from input to output. The logic function thus performed may be represented by the symbolic representation of FIG. 1C.

Referring to FIG. 2A a bidirectional bipolar logic transmission gate having a first input/output terminal 51 and a second input/output terminal 52 is shown. First and second switching transistors 53 and 54 are connected to pass signals from terminal 51 to terminal 52. On the other hand switching transistors 56 and 57 are connected to pass signal inputs at terminal 52 to terminal 51 in the second direction of the bidirectional gate. A source transistor 59 having plural collectors 61 and 62 provides injected carriers and is thus associated with switching transistors 53 and 56. Source transistor 63 having plural collectors 64 and 66 provides carrier injection for transistors 54 and 57 and is associated with said transistors and further, as has been previously described, has an emitter 67 connected to the gate control input 68. Transistor 63 has a base 69 connected to a common terminal 71. Transistor 59 has a base terminal 72 connected to a common terminal 73. Transistor 59 has an emitter 74 connected to a supply terminal 76. Returning to the first and second transistors 53 and 54 signal path from terminal 51 to 52, transistor 53 has a base 78 connected to terminal 51, an emitter 79 connected to common terminal 71 and a collector 81 connected to a gate logic node A and also to the base 83 of transistor 54. Collector 64 of transistor 63 is also connected to gate logic node A. Transistor 54 has an emitter 84 connected to a common terminal 71 and a collector 86 connected to terminal 52. Collector 61 of transistor 59 is also connected to terminal 52. Collector 62 of transistor 59 is connected to terminal 51.

Referring now to the signal path from terminal 52 to terminal 51, transistor 56 has a base terminal 87 connected to terminal 52, an emitter 88 connected to common ground terminal 71 and a collector 89 connected to a gate logic node A' also connected to base 91 of transistor 57. Collector 66 of transistor 63 is also connected to gate logic node A'. Transistor 57 has an emitter 92 connected to a common terminal 71 and a collector 93 connected to terminal 51. A symbolic representation of the FIG. 2A circuit is shown in 2B.

Turning to operation of the FIG. 2A and 2B structure, it is apparent that the general operation is similar to that previously described with the additional circuitry providing bidirectional operation. When a first or high logic level is applied to terminal 68, nodes A and A' can now rise above ground potential so that any input at terminal 51 freely passes via transistor 53 and 54 through output terminal 52. Simultaneously node A can now rise above ground potential and a signal input at terminal 52 will pass freely via transistor 56 and 57 to terminal 51. Accordingly signals may pass in either direction at the input/output terminals 51 and 52. When a second or low logic level is applied to terminal 68, both logic nodes A and A' cannot rise above ground potential so that any input to transistors 53 and 56 respectively is blocked and the outputs of transistors 54 and 57 remain at ground, said respective transistors no longer having carrier injection from source transistor.

Referring to FIG. 3A, a collector-up EXCLUSIVE OR gate 140 is shown including first and second switching transistors 141, 142 and collector-up structure 20 as previously defined. Transistor 141 has a base 144 connected to a first input terminal 146, an emitter 147 connected to a second input terminal 148 and a collector connected to the input of collector-up structure 20.

Second transistor 142 has a base terminal 151 connected to second input terminal 148, an emitter 152 connected to first input terminal 146 and a collector 153 connected to the input of collector-up structure 20. An output, EXCLUSIVE OR terminal 154 is connected to the output of collector-up structure 20. FIG. 3B is a symbolic representation of the FIG. 3A gate. FIG. 3D is a top view of a semiconductor structure implementing the first and second transistors 141 and 142 of the FIG. 3A structure, wherein the prime numbers represent the corresponding callouts of the FIG. 3A gate, with the EXCLUSIVE OR, $\overline{XOR}$, output line being connected to the input of a collector-up structure as previously shown and symbolized by reference 20. In the structure, an N type semiconductor body 18 having a substantially planar surface 10 has spaced P type regions formed in the body and extending to surface 10, next spaced, respective type N regions are formed within the P type regions and extending to surface 10. A $V_{cc}$ supply BUS 37 may be insulated from and carried by body 18 to route voltage means within the collector-up structure.

The FIG. 3A structure may be further cascaded as shown in FIG. 3C. In FIG. 3C, switching transistors 141 and 142 may be provided and in addition an identical circuit may have inputs C and D and provide an output of the EXCLUSIVE OR C and D. Additional transistors 161 and 162 may be identically connected as are transistors 141 and 142 wherein the first input of these cascaded devices is connected to the output of the first 141 and 142 combination and the second input is connected to the second 141 and 142 combination to thereby provide the complement EXCLUSIVE OR function of all four inputs A, B, C and D, at terminal 175.

Referring to FIGS. 4A – C, a Divide-by-Two gate, symbolic diagram, and semiconductor structure are respectively shown. Gate signal control input terminal 185 is connected to bases 188 and 198 of transistors 187 and 196 respectively, and terminal 186 is connected to respective bases 192 and 203 of transistors 191 and 201 respectively. The emitters 190 and 193 of transistors 187 and 189 are connected to the input of the collector-up device 20, and the output of device 20 is connected to the input of device 25. The emitters 199 and 202 of devices 196 and 201 are connected to the input of an additional collector-up device 20 having an output connected to the input of additional collector of device 25. Collector 199 is connected to the output of the first mentioned collector-up structure 25 and also collector 197 of transistor 196. Collector 204 of transistor 201 is connected to the output of additional collector-up device 25 and connected to output terminal 212. Collector 194 of transistor 191 is connected to the input of additional collector-up device 25 and also to output terminal 211.

In operation, an input signal having a first period T and having input C and complement $\overline{C}$ is provided at terminals 186 and 185 respectively. The signal is caused to propagate with time via the respective transistor pairs 187 and 196 and alternately 191 and 201, passing via first mentioned collector-up structures 20 and 25 and alternately additional collector-up structures 20 and 25 to thereby provide an output signal at terminals 211 and 212 having a period 2T. The gate structure of FIG. 4A may be implemented by connecting a semiconductor structure as shown in FIG. 4C. In the semiconductor structure, an N type semiconductor body having a substantially planar surface 10 has the P type regions first formed in said body extending to said surface. Next, the N respective regions are formed within the respective type P regions and spaced to provide in the transistors respective spaced collector and emitter regions.

Thus it is apparent that ther has been provided improved performance, unidirectional and bidirectional transmission gates in bipolar technology. In particular, a unidirectional and bidirectional transmission gate implemented in integrated injection logic or collector-up circuitry.

I claim:

1. In an inverting bipolar logic gate of the type having an input, an output, gate control, supply and common terminals, a logic circuit having PNP and NPN conductivity type transistors including, a switching transistor, a source transistor having opposite conductivity from and associated with said switching transistor and having a spaced relationship thereto capable of injected carrier communication with said switching transistor, said transistors each having collector, base and emitter electrodes, said collector of the switching transistor connected to the output terminal, and defining a gate logic node, the base to the input terminal and the emitter to the common terminal, and wherein the collector of the source transistor is connected to the base of the switching transistor, the source transistor base is connected to common and the emitter is connected to the supply terminal, and gate switching means connected between said gate logic node and said gate control input comprising solely a single gate switching transistor having collector, base and emitter electrodes having an opposite conductivity from said switching transistor, the collector of said gate switching transistor being of differing conductivity from said switching transistor collector and connected to said gate logic node, said base connected to the common terminal and said emitter to said gate control input wherein said gate switching transistor is responsive to first and second logic levels at said gate control input for driving said gate logic node to first and second states and causing the gate to assume open and closed states from input to output.

* * * * *